(12) United States Patent
Kurose (10) Patent No.: US 8,682,264 B2
(45) Date of Patent: Mar. 25, 2014

(54) DIGITAL-TO-ANALOG CONVERTER AND WIRELESS COMMUNICATION APPARATUS

(75) Inventor: Daisuke Kurose, Kawasaki (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 238 days.

(21) Appl. No.: 13/238,033

(22) Filed: Sep. 21, 2011

(65) Prior Publication Data
US 2012/0071114 A1 Mar. 22, 2012

(30) Foreign Application Priority Data

Sep. 21, 2010 (JP) .................................. 2010-211274

(51) Int. Cl.
*H04B 1/02* (2006.01)
*H03M 1/66* (2006.01)

(52) U.S. Cl.
USPC ........................... 455/91; 455/114.2; 341/144

(58) Field of Classification Search
USPC .......... 455/91, 114.2; 375/295; 341/110, 144; 327/103, 108
See application file for complete search history.

(56) References Cited

U.S. PATENT DOCUMENTS

| 6,559,784 B1* | 5/2003 | Schofield et al. ............. 341/144 |
| 6,603,417 B2* | 8/2003 | Greig ............................ 341/136 |
| 7,388,531 B1* | 6/2008 | Cyrusian ....................... 341/144 |
| 7,978,107 B1* | 7/2011 | Mao et al. ..................... 341/142 |

FOREIGN PATENT DOCUMENTS

| JP | 1-289319 A | 11/1989 |
| JP | 2-288731 A | 11/1990 |

OTHER PUBLICATIONS

First Office Action dated Sep. 4, 2012 from corresponding JP Patent Application No. 2010-211274, 5 pages.
Wu, et al., A 130 nm CMOS 6-bit Full Nyquist 3 GS/s DAC; IEEE Journal of Solid-State Circuits, vol. 43, No. 11, Nov. 2008, pp. 2396-2403.

* cited by examiner

*Primary Examiner* — Quochien B Vuong
(74) *Attorney, Agent, or Firm* — Ohlandt, Greeley, Ruggiero & Perle, L.L.P.

(57) ABSTRACT

According to one embodiment, a digital-to-analog converter includes a plurality of cells. Each cell includes a current source and a differential switch. The current source includes a first transistor arranged in a first region and connected to either a power source or a ground, a second transistor arranged in a second region which is different from the first region and connected directly or indirectly with the first transistor in a cascode configuration, and a metallic interconnect connecting the first region and the second region electrically. The differential switch includes a pair of transistors, each connected to the second transistor and arranged in the second region.

8 Claims, 7 Drawing Sheets

DIGITAL-TO-ANALOG CONVERTER AND WIRELESS COMMUNICATION APPARATUS

CROSS-REFERENCE TO RELATED APPLICATIONS

This application is based upon and claims the benefit of priority from prior Japanese Patent Application No. 2010-211274, filed Sep. 21, 2010, the entire contents of which are incorporated herein by reference.

FIELD

Embodiments described herein relate generally to circuit layout of a digital-to-analog converter.

BACKGROUND

A so-called current steering digital-to-analog converter has a plurality of cells which cooperate to realize high-speed digital-to-analog conversion. Each cell includes a current source and a differential switch which leads a current produced by the current source to a positive or negative output terminal. When a cell is arranged on a semiconductor integrated circuit chip, in general, a current source and a differential switch are arranged in different (i.e., separately-formed) regions to prevent degradation by digital noise of the accuracy of the current source. More specifically, current sources of all the cells are arranged in a form of matrix on a first region and differential switches of all the cells are arranged in a form of matrix on a second region which is different from the first region. Each of the current sources in the first region and each of the differential switches in the second region are electrically connected by metallic interconnect.

Usually, the number of cells included in a current steering digital-to-analog converter increases in accordance with the number of bits of the input digital signal. As the number of bits increases, the area of the first and second regions expands; as a result, the metallic interconnects connecting those regions need to be elongated.

Elongating metallic interconnects increases parasitic capacitance which accompanies the metallic interconnects. The greater the parasitic capacitance is, the greater the moving (i.e., charging and discharging) charge at the parasitic capacitor which is caused by on-off operation of the differential switch becomes. Thus, elongated metallic interconnects cause a larger spike voltage (such phenomena is called glitch) and lead to degradation of output signal accuracy.

DETAILED DESCRIPTION

Various embodiments will be described hereinafter with reference to the accompanying drawings.

In general, according to one embodiment, a digital-to-analog converter includes a plurality of cells. Each cell includes a current source and a differential switch. The current source includes a first transistor arranged in a first region and connected to either a power source or a ground, a second transistor arranged in a second region which is different from the first region and connected directly or indirectly with the first transistor in a cascode configuration, and a metallic interconnect connecting the first region and the second region electrically. The differential switch includes a pair of transistors, each connected to the second transistor and arranged in the second region.

For simplicity, it is assumed that the embodiments are applied to a current steering digital-to-analog converter. However, the embodiments can be applied to other digital-to-analog converters similar to current steering digital-to-analog converters, as needed.

Also, in each of the drawings, a transistor of a specific type and with a specific polarity is illustrated as an example; however, the transistors in the drawings may be replaced with any arbitrary transistor with any arbitrary polarity. For example, a p-type metal-oxide semiconductor (PMOS) transistor may be replaced with an n-type metal-oxide semiconductor (NMOS) transistor, or a bipolar transistor may be replaced with a different type of transistor.

In the drawings, the same or like elements are denoted by the same or like respective reference numbers. Generally, redundant explanation will be avoided.

First Embodiment

Figure 1:
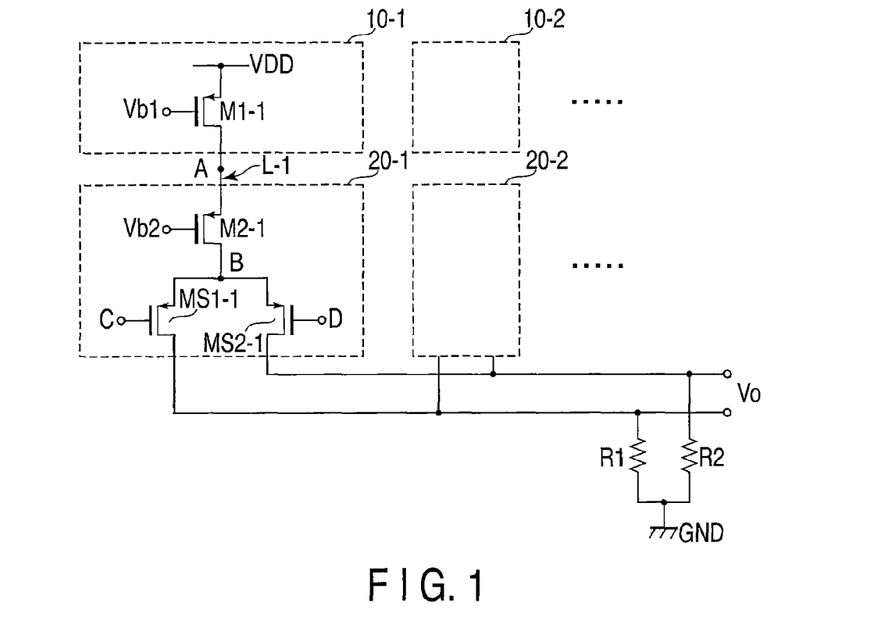
FIG. 1 shows an example of a digital-to-analog converter according to a first embodiment.

As shown in FIG. 1, the digital-to-analog converter according to the first embodiment includes a plurality of cells and a pair of resistors R1 and R2. In the following explanation, an arbitrary cell will be described for simplicity. A cell includes a current source and a differential switch. The digital-to-analog converter of FIG. 1 controls each of the differential switches of the plurality of cells based on an input digital signal to lead a current produced by the current source to a positive or negative output terminal. Output differential currents from the plurality of cells are added at an output terminal and they are converted to an output differential voltage Vo (i.e., an output analog signal) by the pair of resistors R1 and R2.

The current source includes a transistor M1-1 and a transistor M2-1 which is connected with the transistor M1-1 in a cascode configuration. The current produced by transistors M1-1 and M2-1 is determined by a reference current source (not shown). The differential switch includes a pair of switches MS1-1 and MS2-1 which turns on and off complementarily in accordance with gate voltages and which leads a current produced by the current source in a positive or negative direction. In the following explanation, each of transistors MS1-1 and MS2-1 may be referred to as a switch.

Voltage Vb1 is applied to the gate terminal of transistor M1-1, and a power source voltage VDD is applied to the source terminal of transistor M1-1. Transistor M1-1 is arranged on a partial region 10-1 of a first region 10. The drain terminal of transistor M1-1 is connected to the source terminal of transistor M2-1 via a metallic interconnect L-1. A node between the drain terminal of transistor M1-1 and the source terminal of transistor M2-1 (i.e., on a metallic interconnect L-1 shown in FIG. 1) is hereinafter referred to as node A.

Voltage Vb2 is applied to the gate terminal of transistor M2-1. The drain terminal of transistor M2-1 is connected to the source terminals of the pair of transistors MS1-1 and MS2-1 in common. A node between the drain terminal of transistor M2-1 and the source terminals of the pair of transistors MS1-1 and MS2-1 is hereinafter referred to as node B. Transistor M2-1 is arranged on a partial region of 20-1 of the second region 20.

The first region 10 includes a plurality of partial regions 10-1, 10-2, . . . . Each of the partial regions corresponds to single cell. These partial regions 10-1, 10-2, . . . are formed typically in a form of matrix. The second region 20 also includes a plurality of partial regions 20-1, 20-2, . . . . Each of the partial regions corresponds to single cell. These partial regions 20-1, 20-2, . . . are formed typically in a form of matrix. The first region 10 and the second region 20 occupy different positions (i.e., formed separately) on a semiconductor integrated circuit chip, as shown in FIG. 2.

A driving voltage is applied to the gate terminal of transistor MS1-1 from a switch driver (not shown). On the other hand, a driving voltage is also applied to the gate terminal of transistor MS2-1 from a different switch driver (not shown). Hereinafter, the gate terminals of the pair of transistors MS1-1 and MS2-1 are respectively referred to as node C and node D. The drain terminals of the pair of transistors MS1-1 and MS2-1 correspond to the output terminals of the cells, and they output a differential current.

Figure 2:
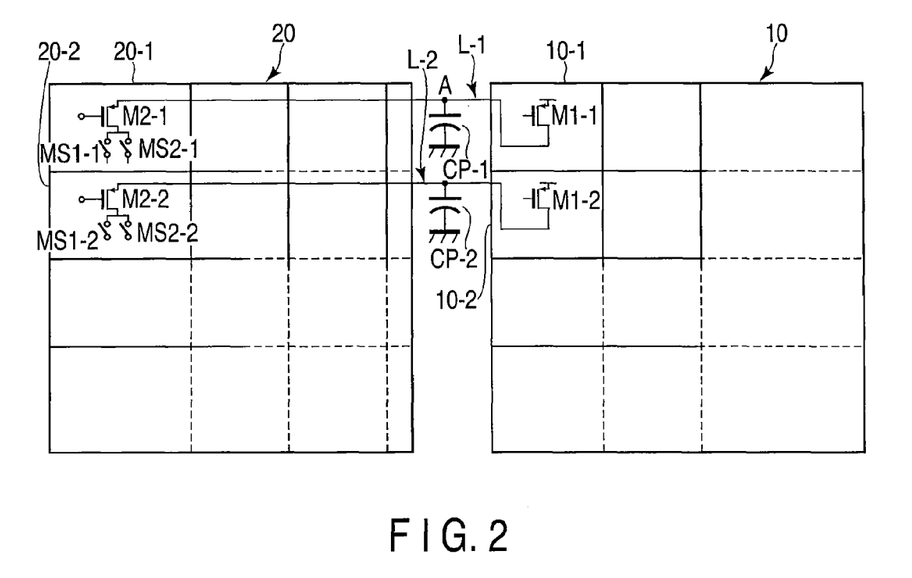
FIG. 2 shows an example of the digital-to-analog converter according to the first embodiment.

As shown in FIG. 2, parasitic capacitor CP-1 of metallic interconnect L-1 is virtually connected to node A. Capacitance CP-1 becomes greater as metallic interconnect L-1 becomes longer (larger, precisely). The length of metallic interconnect L-1 depends on the distance between partial region 10-1 and partial region 20-1. Consequently, when the area of the first region 10 and the second region 20 becomes larger as the number of bits of the input digital signal, the need to elongate metallic interconnect L-1 arises.

A comparative example of the digital-to-analog converter according to the present embodiment will be explained below. When cells are laid out on a semiconductor integrated circuit chip, the current source and the differential switch are, in general, arranged in different regions. More specifically, the current source is arranged in the first region and the differential switch in the second region; and each current source in the first region and each differential switch in the second region are electrically connected via a metallic interconnect.

Figure 3:
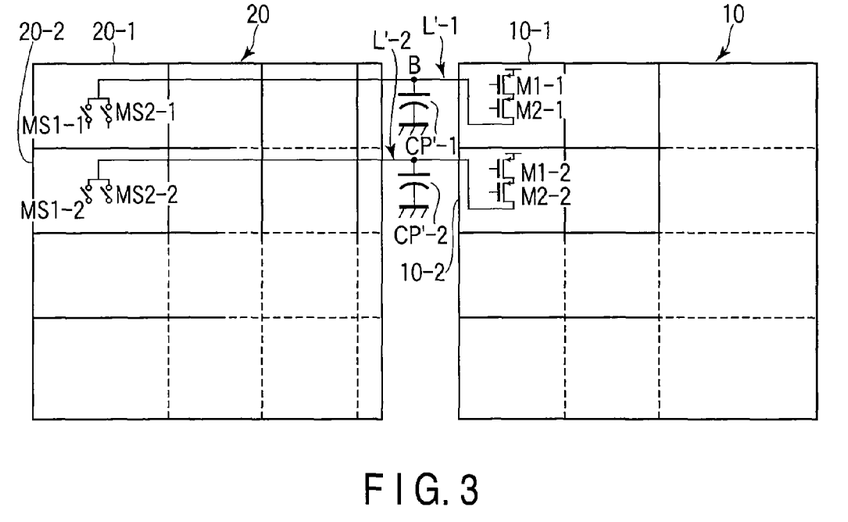
FIG. 3 shows a digital-to-analog converter according to a comparative example.
Figure 5:
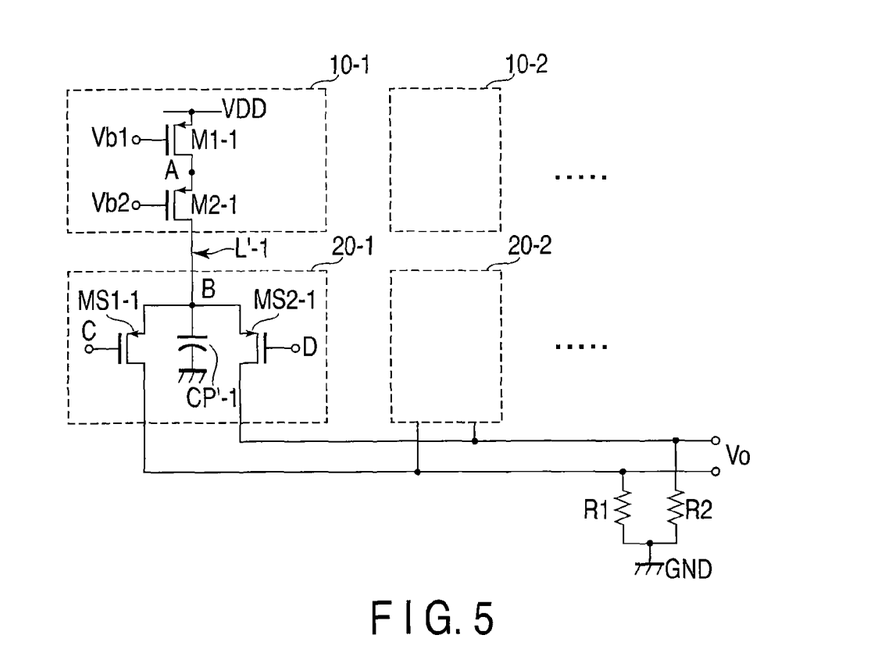
FIG. 5 shows the digital-to-analog converter according to the comparative example.

In light of such a design concept, the current sources (transistors M1-1 and M2-1) and the differential switch (the pair of transistors MS1-1 and MS2-1) are connected by metallic interconnect L'-1, as shown in FIGS. 3 and 5. In other words, in the comparative example, parasitic capacitor CP'-1 of metallic interconnect L'-1 is virtually connected to node B, not to node A.

Figure 4:
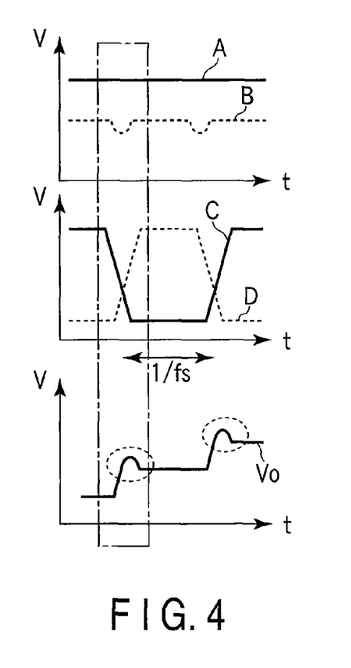
FIG. 4 is a graph showing voltage fluctuations at each node in the digital-to-analog converter according to the comparative example.

The voltage fluctuation at each node in the comparative example is shown in FIG. 4. In FIG. 4, fs represents a sampling frequency. According to FIG. 4, the voltage at node B fluctuates in accordance with the on-off operation of the differential switch, and charging and discharging of parasitic capacitor CP'-1 occurs. For example, when the voltage at node C rises and the voltage at node D falls, switch MS1-1 is turned on and switch MS2-1 is turned off, charges move from parasitic capacitor CP'-1 via node B and transistor MS1-1, and the charges are added to the output differential current. In other words, the charging and discharging at parasitic capacitor CP'-1 causes a glitch, and as a result, accuracy of an output analog signal Vo is degraded.

In contrast, in the digital-to-analog converter according to the present embodiment, parasitic capacitor CP-1 of metallic interconnect L-1 is connected to node A. The voltage at node A becomes stable through the effect of transistor M2-1 which is connected with transistor M1-1 in a cascode configuration. In other words, the voltage fluctuation at node A is not as pronounced as that at node B. For this reason, the amount of charging and discharging at parasitic capacitor CP-1 connected to node A is reduced, thereby inhibiting the degradation of accuracy of the output analog signal Vo.

As explained above, in the digital-to-analog converter according to the first embodiment, the transistors connected in a cascode configuration are adopted as a current source, and one of the transistors is arranged separately from the other but on the same region as the differential switch, and it is connected to the other by a metallic interconnect. Thus, according to the digital-to-analog converter according to the present embodiment, degradation of accuracy of the output analog signal can be inhibited because the voltage applied to the parasitic capacitor of the metallic interconnect becomes more stable, compared to a case of arranging a current source on single region.

Now elements that are not shown in FIGS. 1 and 2 are briefly explained. In addition to the aforementioned plurality of cells, the digital-to-analog converter illustrated in FIG. 10 includes a reference current source 30, a decoder 41, a decoder 42, a switch driver 50 and a clock driver 60.

Figure 10:
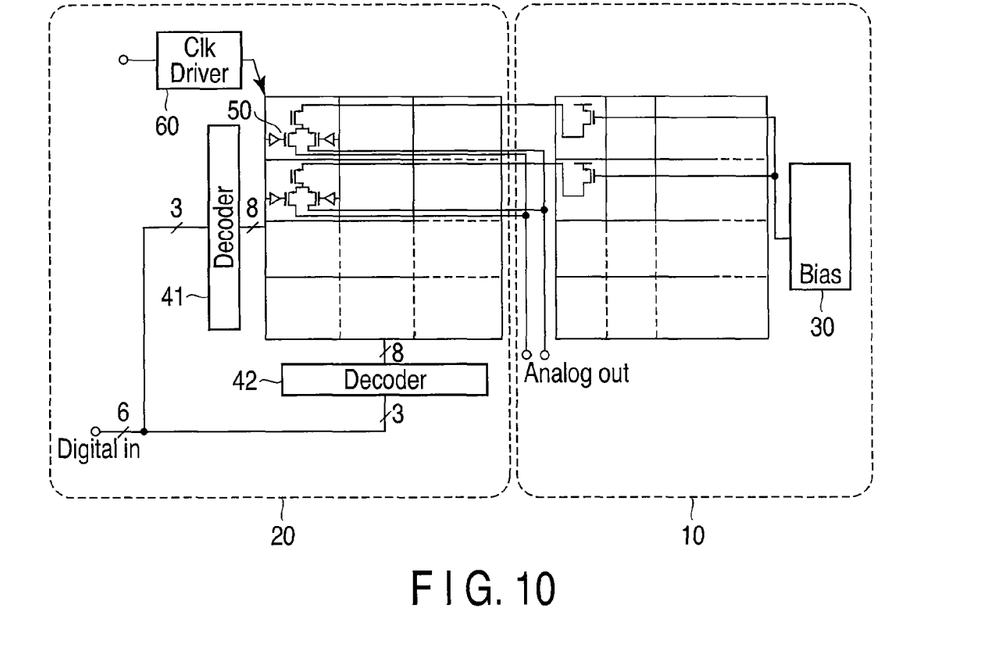
FIG. 10 shows an example of the digital-to-analog converter according to the first embodiment.

The reference current source 30 is arranged in the first region 10 and determines the current produced by a current source in each cell. More specifically, the reference current source 30 inputs a gate voltage Vb1 to transistor M1-1 in a cell.

The decoders 41 and 42 are arranged in the second region 20. Each of the decoders 41 and 42 receives three bits of each of input digital signals (for example, six-bit binary codes), and convert them into a 8-bit thermometer code. The thermometer code is used to control the on-off operation the differential switch in each cell.

The switch driver 50 is arranged in the second region 20, and drives the differential switch in each cell. More specifically, the switch driver 50 applies a driving voltage to the gate terminal of a corresponding transistor. The clock driver 60 is arranged in the second region 20, and distributes a clock signal to each cell. With this clock signal, a signal synchronized with a clock is input to the switch driver 50 in each cell.

Second Embodiment

The second embodiment allows a current source in a cell to include three or more transistors connected in a cascode configuration. In other words, in the present embodiment, it is assumed that a transistor at the highest level (i.e., a transistor M1-1) is indirectly connected (via at least one transistor) to a transistor at the lowest level (i.e., a transistor connected to a differential switch) in a cascode configuration. On the other hand, in the first embodiment, it is assumed that the transistor at the highest level and the transistor at the lowest level are connected directly in a cascode configuration. For simplicity, an example of a current source including three transistors connected in a cascode configuration will be described in the following explanation.

Figure 7:
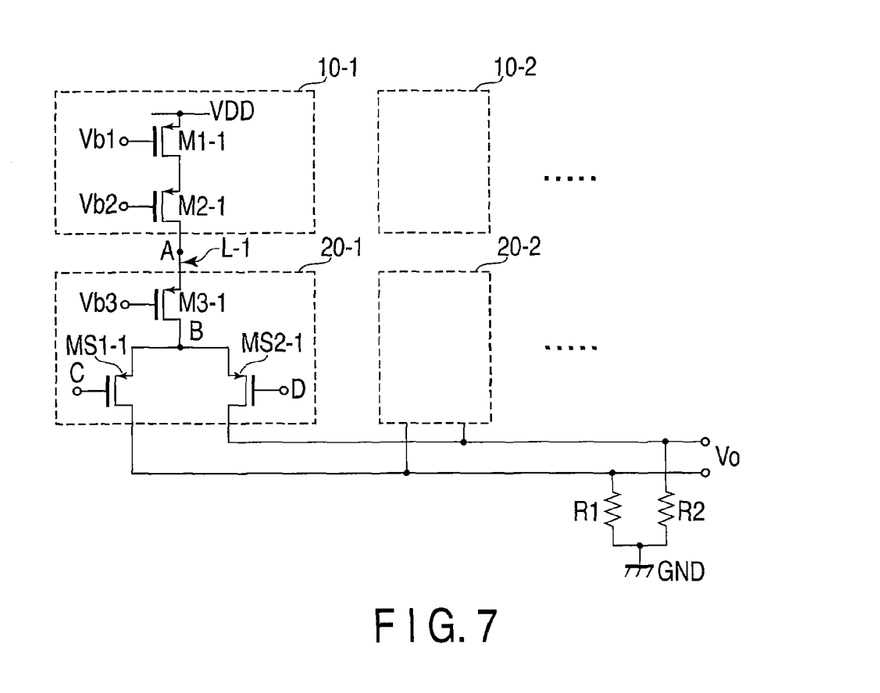
FIG. 7 shows an example of the digital-to-analog converter according to a second embodiment.

As shown in FIG. 7, in the digital-to-analog converter according to the present embodiment, in addition to transistors M1-1 and M2-1, a current source in a cell further includes a transistor M3-1 which is connected with transistor M2-1 in a cascode configuration. In other words, transistor M3-1 is connected with transistor M1-1 indirectly in a cascode configuration via transistor M2-1.

Transistor M2-1 is arranged in a partial region 10-1 of a first region 10. However, it should be noted that this arrangement is merely an example; transistor M2-1 may arranged in a partial region 20-1 of a second region 20. The drain terminal of transistor M2-1 is connected to the source terminal of transistor M3-1 by metallic interconnect L-1. Hereinafter, a node between the drain terminal of transistor M2-1 and the source terminal of transistor M3-1 will be referred to as node A.

Voltage Vb3 is applied to the gate terminal of transistor M3-1. The drain terminal of transistor M3-1 is connected in common to the source terminals of the pair of transistors MS1-1 and MS2-1. Hereinafter, a node between the drain terminal of transistor M3-1 and the source terminals of the pair of transistors MS1-1 and MS2-1 will be referred to as node B. Transistor M3-1 is arranged in partial region 20-1 of the second region 20.

In the digital-to-analog converter according to the present embodiment, parasitic capacitor CP-1 of metallic interconnect L-1 is connected to node A, in a manner similar to the first embodiment. The voltage at node A becomes stable by the effect of transistor M3-1 connected with transistor M2-1 in a cascode configuration. In other words, the voltage fluctuation at node A is not as pronounced as that at node B. For this reason, the amount of charging and discharging of the parasitic capacitor connected to node A is reduced, and thus, the degradation of output analog signal accuracy can be inhibited.

As explained above, the second embodiment applies the first embodiment when a current source includes three or more transistors connected in a cascode configuration. Thus, according to the digital-to-analog converter according to the present embodiment, the advantageous effect same as or similar to that achieved by the first embodiment can be achieved when a current source includes three or more transistors connected in a cascode configuration.

It should be noted that in the case of a current source including four ore more transistors connected in a cascode configuration, the transistor at the highest level is arranged in partial region 10-1 of the first region 10, and the transistor at the lowest level is arranged in partial region 20-1 of the second region 20. The other transistors may be arranged in either partial region 10-1 or partial region 20-1.

Third Embodiment

Figure 6:
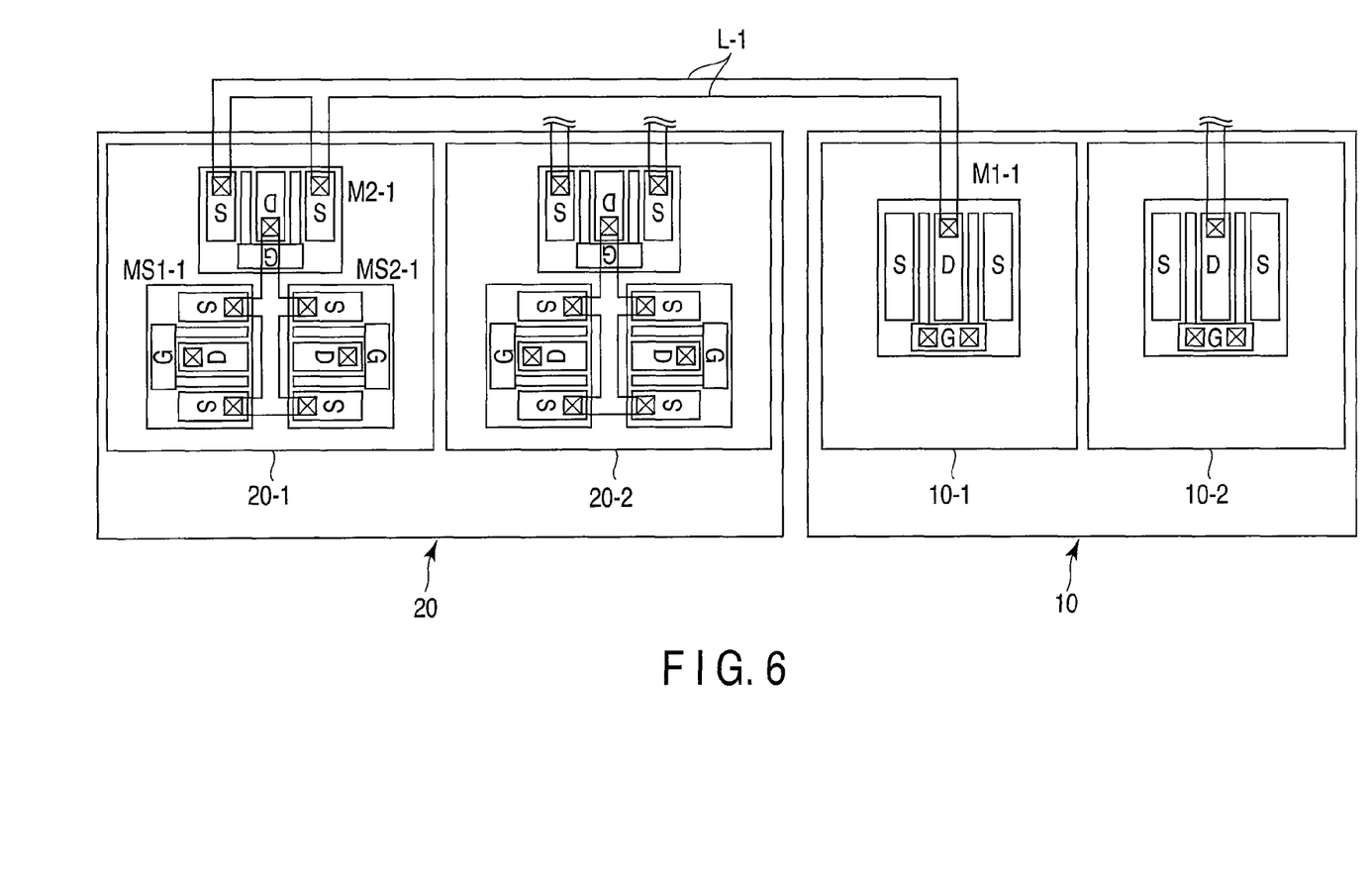
FIG. 6 shows an example of a digital-to-analog converter circuit layout according to a third embodiment.

In the digital-to-analog converter according to the third embodiment, the size (gate length, gate width, etc.) of transistor M1-1 is different from that of transistor M2-1 both included in the current source. More specifically, as shown in FIG. 6, transistor M2-1 is formed smaller than transistor M1-1. By making transistor M2-1 smaller, the parasitic capacitance of transistor M2-1 is reduced, thereby further stabilizing the voltage at node A.

Figure 8:
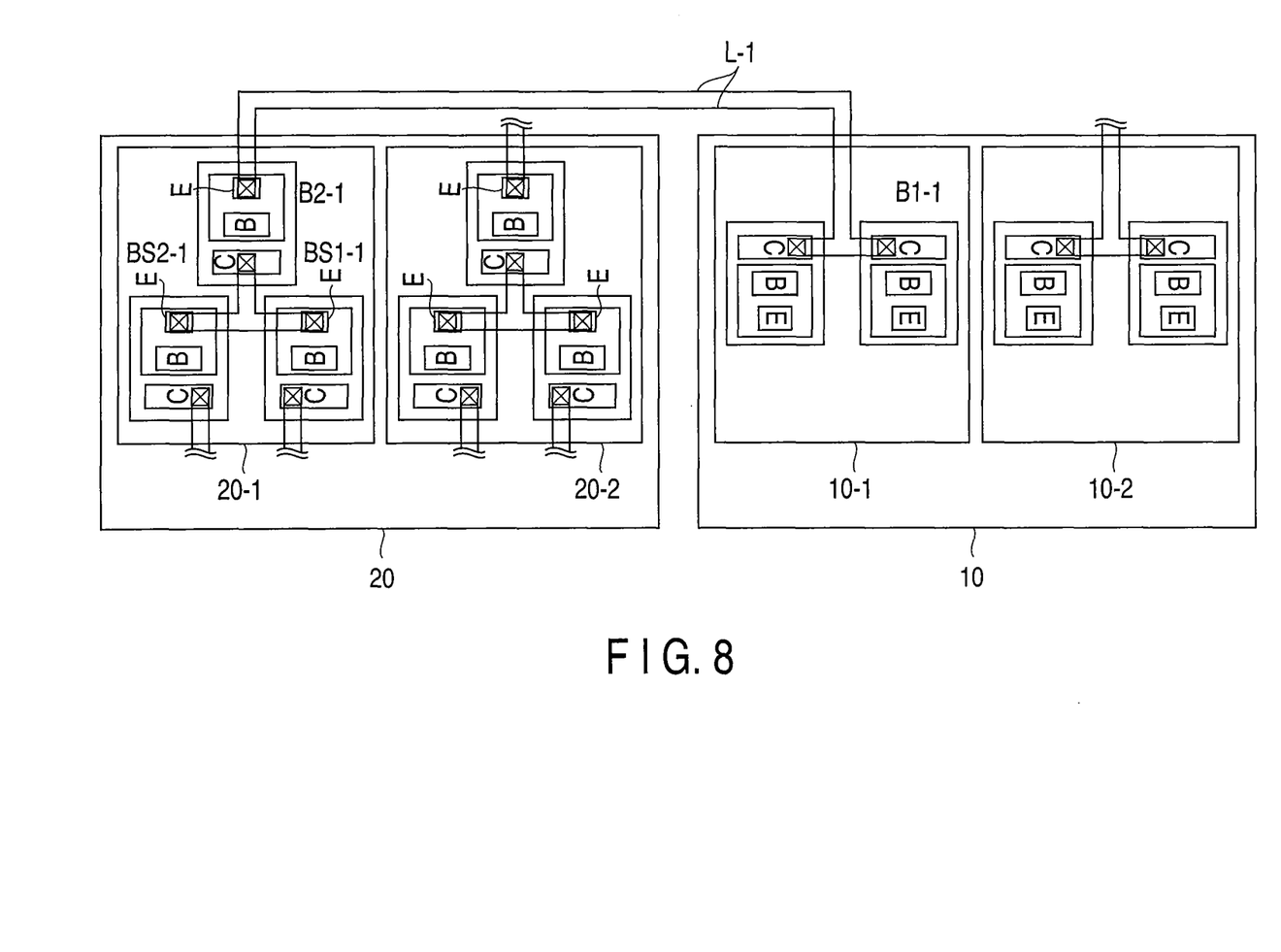
FIG. 8 shows an example of the digital-to-analog converter circuit layout according to the third embodiment.

An example in which each PMOS transistor illustrated in FIG. 6 is replaced with an npn bipolar transistor is shown in FIG. 8. The parasitic capacitance of transistor M2-1 can be also reduced with this layout.

In the second embodiment, an example of a current source including three or more transistors is described. When a current source includes three or more transistors, the transistor at the lowest level should be formed smaller than the transistor at the highest level. The sizes of the other transistors are not necessarily specified.

As explained above, in the digital-to-analog converter according to the third embodiment, a transistor at the lowest level of the current source is formed smaller than the transistor at the highest level of the current source, thereby reducing the parasitic capacitance of the transistor at the lowest level. Thus, according to the digital-to-analog converter according to the present embodiment, the voltage applied to the parasitic capacitor of metallic interconnect can become more stable, thereby facilitating inhibiting the degradation of output analog signal accuracy.

Fourth Embodiment

Figure 9:
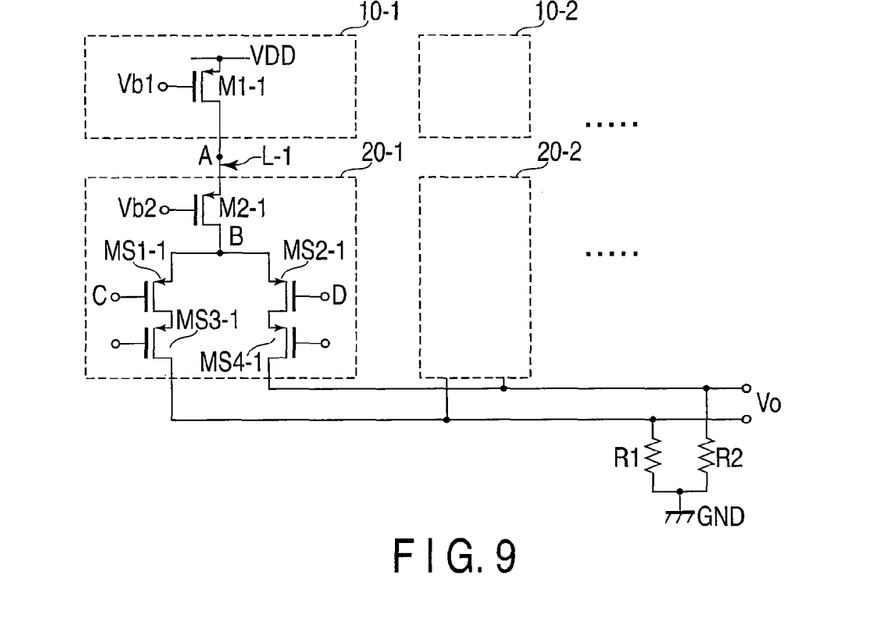
FIG. 9 shows an example of the digital-to-analog converter according to a fourth embodiment.

The digital-to-analog converter according to the fourth embodiment is different from each of the above-described embodiments in the configuration of a differential switch. As shown in FIG. 9, in the digital-to-analog converter according to the present embodiment, the differential switch in a cell includes transistors MS1-1 and MS3-1 connected in a cascode configuration and transistors MS2-1 and MS4-1 connected in a cascode configuration.

According to the differential switch including a pair of transistors connected in a cascode configuration, the parasitic capacitance between the gate terminal and the drain terminal of transistor MS3-1 and transistor MS 4-1 can be reduced. Thus, the voltage at the drain (output) terminal of the differential switch becomes stable.

As explained above, in the digital-to-analog converter according to the fourth embodiment, the differential switch includes a pair of transistors in a cascode configuration. Thus, according to the digital-to-analog converter according to the present embodiment, the voltage at the drain terminal of the differential switch becomes stable, thereby facilitating inhibiting degradation of the output analog signal accuracy.

Fifth Embodiment

Figure 11:
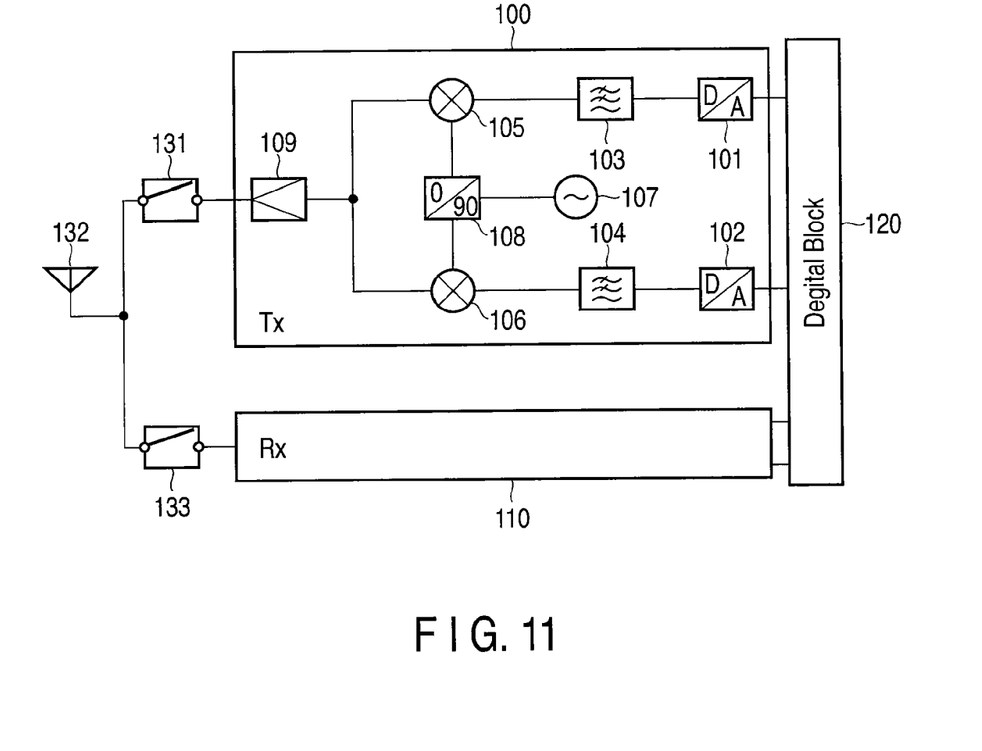
FIG. 11 is a block diagram showing an example of a transmitter according to a fifth embodiment.

A wireless communication apparatus according to the fifth embodiment includes the digital-to-analog converter according to each of the above-described embodiments. As shown in FIG. 11, the wireless communication apparatus according to the fifth embodiment includes a transmission unit 100, a reception unit 110, a digital signal processing unit 120, a switch 131, an antenna 132 and a switch 133.

The digital signal processing unit 120 supplies transmitted data to a transmission unit 100 and receives received data from the reception unit 110. The reception unit 110 receives a received signal from the antenna 132 via switch 133, and reconstructs the received data.

The transmission unit 100 receives the transmitted data from the digital signal processing unit 120 and produces a transmission signal. Specifically, the transmission unit 100 includes a digital-to-analog converter 101, a digital-to-analog converter 102, a low-pass filter (LPF) 103, an LPF 104, a mixer 105, a mixer 106, a local oscillator 107, a phase shifter 108 and a power amplifier (PA) 109.

Digital-to-analog converters 101 and 102 correspond to the digital-to-analog converters according to each of the above-described embodiments. Digital-to-analog converter 101 receives transmitted date of an in-phase channel (I-channel) from the digital signal processing unit 120, converts it to an analog domain. Digital-to-analog converter 102 receives transmitted data of a quadrature-phase channel (Q-channel) from the digital signal processing unit 120, and converts it into the analog domain.

LPF 103 performs filtering processing to suppress a low-pass component of an output analog signal from digital-to-analog converter 101. LPF 104 performs out filtering processing to suppress a low-pass component of an output analog signal from digital-to-analog converter 102.

The local oscillator 107 produces a local oscillation signal having a predetermined local frequency. The phase shifter 108 shifts the phase of the local oscillation signal from the local oscillator 107 by 90 degrees, and then supplies the shifted local oscillation signal to mixer 106.

Mixer 105 multiplies the local oscillation signal from the local oscillator 107 by the output signal from LPF 103. Mixer 106 multiplies the local oscillation signal which is shifted by 90 degrees by the phase shifter 108 by the output signal from LPF 104. The output signals from mixers 105 and 106 are synthesized and an orthogonally modulated signal is obtained.

The PA 109 amplifies the power of the orthogonally modulated signal and supplies it to the antenna 132 via the switch 131. The antenna 132 emits the signal from the PA 109 into space.

As explained above, the wireless communication apparatus according to the fifth embodiment includes the digital-to-analog converters according to each of the above-described embodiments. Therefore, according to the wireless communication apparatus according to the present embodiment, the advantageous effect same as or similar to that achieved by each of the above-described embodiments can be achieved.

It should be noted that the wireless communication apparatus shown in FIG. 11 is merely an example. The wireless communication apparatus according to the present embodiment may include an element that is not shown in FIG. 11, or may not include any of the elements shown in FIG. 11. In addition, the wireless communication apparatus of FIG. 11 is capable of receiving and transmitting. However, the digital-to-analog converters according to each of the above-described embodiments is applicable to a wireless communication apparatus exclusively for transmitting (i.e., a transmitter).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A digital-to-analog converter, comprising a plurality of cells, each cell comprising a current source and a differential switch,
   wherein the current source includes a first transistor connected to either a power source or a ground, a second transistor connected directly or indirectly with the first transistor in a cascode configuration, a first metallic interconnect connecting the first transistor and the second transistor electrically, and a second metallic interconnect connecting the second transistor and the differential switch
   the differential switch includes a pair of transistors, each connected to the second transistor,
   in each of the cells, the first transistor is arranged in a first region,
   in each of the cells, the second transistor and the pair of transistors are arranged in a second region which is different from the first region,
   in each of the cells, the second metallic interconnect is shorter than the first metallic interconnect.

2. The digital-to-analog converter according to claim 1, wherein, the size of the second transistor is smaller than that of the first transistor.

3. The digital-to-analog converter according to claim 1, wherein
   the first region and the second region are formed on a semiconductor integrated circuit chip, and
   the first transistors in the plurality of cells are arranged in a form of matrix in the first region.

4. The digital-to-analog converter according to claim 1, wherein
   the first region and the second region are formed on a semiconductor integrated circuit chip, and
   the second transistors and the differential switches in the plurality of cells are arranged in a form of matrix in the second region.

5. The digital-to-analog converter according to claim 1, further comprising:
   a reference current source arranged in the first region and configured to determine current produced by each of the current sources in the plurality of cells;
   a decoder arranged in the second region and configured to convert an input digital signal to a thermometer code; and
   a driver arranged in the second region and configured to drive the differential switches in the plurality of cells in accordance with the thermometer code.

6. A wireless communication apparatus, comprising:
   the digital-to-analog converter according to claim 1 which converts an input digital signal to an output analog signal; and
   an analog signal processing unit configured to perform a process for transmitting the output analog signal.

7. A digital-to-analog converter, comprising a plurality of cells, each cell comprising a current source and a differential switch,
   wherein the current source includes a first transistor arranged in a first region and connected to either a power source or a ground, a second transistor arranged in a second region which is different from the first region and connected directly or indirectly with the first transistor in a cascode configuration, and a metallic interconnect connecting the first region and the second region electrically;
   the differential switch includes a pair of transistors, each connected to the second transistor and arranged in the second region, and further comprising:
   a reference current source arranged in the first region and configured to determine current produced by each of the current sources in the plurality of cells;
   a decoder arranged in the second region and configured to convert an input digital signal to a thermometer code; and a driver arranged in the second region and configured to drive the differential switches in the plurality of cells in accordance with the thermometer code.

8. A wireless communication apparatus, comprising:

the digital-to-analog converter according to claim 7 which converts an input digital signal to an output analog signal; and an analog signal processing unit configured to perform a process for transmitting the output analog signal.

* * * * *